(12) United States Patent
Yamamoto

(10) Patent No.: US 6,770,957 B2
(45) Date of Patent: Aug. 3, 2004

(54) ADHESIVES, ADHESIVE FILMS AND ELECTRIC DEVICES

(75) Inventor: Satoshi Yamamoto, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 10/369,297

(22) Filed: Feb. 18, 2003

(65) Prior Publication Data

US 2003/0155663 A1 Aug. 21, 2003

(30) Foreign Application Priority Data

Feb. 18, 2002 (JP) .................................. 2002-039760

(51) Int. Cl.⁷ .............................................. H01L 23/495
(52) U.S. Cl. ...................................... 257/666; 257/669
(58) Field of Search .............................. 257/666, 676, 257/669, 674, 735, 788; 428/40.2, 355

(56) References Cited

U.S. PATENT DOCUMENTS 4,933,219 A  *  6/1990  Sakamoto ..................... 428/40
5,942,073 A  *  8/1999  Mowrer ....................... 156/329

FOREIGN PATENT DOCUMENTS

| JP | 11-339559 | 12/1999 | ............ H01B/1/20 |
| JP | 11-345517 | 12/1999 | ............ H01B/1/20 |
| JP | 2000-86988 | 3/2000 | ............. C09J/9/02 |

OTHER PUBLICATIONS

Patent Abstracts of Japan, publication No. 2000–086988, publication date of Mar. 28, 2000 (2 pgs).
Patent Abstracts of Japan, publication No. 11–345517, publication date of Dec. 14, 1999 (1 pg).
Patent Abstracts of Japan, publication No. 11–339559, publication date of Dec. 10, 1999 (1 pg).

* cited by examiner

Primary Examiner—Roy Potter
(74) Attorney, Agent, or Firm—Osha, Novak & May L.L.P.

(57) ABSTRACT

An object of the present invention is to provide an adhesive with which voids are less likely to occur and adherends are not curved. Adhesives of the present invention have excellent dispensability from nozzles of dispensers because the overall specific gravity of the adhesives is adjusted to 1.4 or more and 4.0 or less by adding a filler having a specific gravity of 3.0 or more and 9.0 or less. A highly reliable electric device 1 can be obtained because no voids are generated in an adhesive 12 or an adherend or a flexible wiring board 5 is not curved when the flexible wiring board and a semiconductor chip 11 are connected.

9 Claims, 2 Drawing Sheets

ADHESIVES, ADHESIVE FILMS AND ELECTRIC DEVICES

BACKGROUND OF INVENTION

1. Field of the Invention

The present invention relates to adhesives, more specifically adhesives for connecting a semiconductor chip to a substrate.

2. Background Art

Paste and film adhesives have been used to connect a semiconductor chip onto a substrate or a flexible wiring board.

Reference 101 in FIG. 3 represents an electric device comprising a semiconductor chip 111 bonded to a flexible wiring board 105 with an adhesive 112. Bump terminals 121 carried by the semiconductor chip 111 are in contact with metal lines 122 at the bottom of an opening 119 in the cover film 115 of the flexible wiring board 105.

The terminals 121 on the semiconductor chip 111 are connected to its internal circuit not shown, so that the internal circuit of the semiconductor chip 111 and the metal lines 122 on the flexible wiring board 105 are electrically connected each other via the terminals 121 in the state shown in FIG. 3.

The adhesive 112 has been cured, whereby the semiconductor chip 111 and the substrate 113 are also mechanically connected each other via this adhesive 112.

If the adhesive 112 is used, the semiconductor chip 111 and the flexible wiring board 105 can be thus connected without using solder.

However, the flexible wiring board 105 may be curved in the parts between terminals 121 on the semiconductor chip 111 as shown in FIG. 3, when the conventional adhesive 112 is used. When the flexible wiring board 105 is curved, the internal stress may become uneven, which may result in a short circuit between the flexible wiring board 105 and the semiconductor chip 111 or connection failure after aging.

When the adhesive 112 used for connection is not a film but a paste, air tends to be included in the adhesive 112 during the process of applying the adhesive 112 or heating under pressure, whereby voids may be generated in the adhesive 112 between the semiconductor chip 111 and the flexible wiring board 105. Reference 130 in FIG. 3 represents voids generated in the adhesive 112.

If many voids 130 are present in the adhesive 112, when the electric device 101 has been left to stand for a long time (aging) under high temperature ambience, the semiconductor chip 111 may float from the adhesive 112 on the substrate 113 to invite connection failure in the electric device 101.

What is needed, therefore, is an adhesive that less likely to cause voids in the adhesive and deformation of adherends when it is used for connection.

SUMMARY OF INVENTION

It has been discovered that curved "adherends" result from the uneven residual stress in adhesives resulting from uneven distribution of the adhesives on the adherends after curing.

After studies to prevent the phenomenon described above, it was discovered that when the specific gravity of adhesives is adjusted to 1.4 or more and 4.0 or less by adding a filler having a specific gravity of 3.0 or more and 9.0 or less, the adhesives are not excessively pushed aside during heating under pressure, whereby inclusion of voids or curved adherends can be prevented.

In one aspect, therefore, the present invention provides an adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less.

In one embodiment, the present invention provides the adhesive described above wherein the filler is contained in an amount of 5 parts by volume or more on the basis of the total volume of the binder and the hardener representing 100 parts by volume.

In one embodiment, the present invention provides the adhesive described above wherein the filler is contained in an amount of 35 parts by volume or less on the basis of the total volume of the binder and the hardener representing 100 parts by volume.

In one embodiment, the present invention provides the adhesive described above wherein the thermosetting resin contained in the binder is an epoxy resin.

In one embodiment, the present invention provides the adhesive described above containing conductive particles and having a specific gravity of 1.0 or more and 4.0 or less when the conductive particles are included.

In one embodiment, the present invention provides the adhesive described above wherein the conductive particles comprise resin particles and a metal coating formed on the surfaces of the resin particles.

In one embodiment, the present invention also provides an adhesive film obtained by forming a film of an adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less.

In one embodiment, the present invention also provides an electric device comprising a semiconductor chip and a substrate with an adhesive being inserted between the semiconductor chip and the substrate and cured by heat treatment, wherein the adhesive comprises a binder based on a thermosetting resin, a hardener for the thermosetting resin and an insulating filler, wherein the filler has a specific gravity of 3.0 or more and 9.0 or less and the adhesive has a specific gravity before hardening of the adhesive, 1.4 or more and 4.0 or less.

Advantageously, therefore, embodiments of the present invention provide adhesives having an overall specific gravity of 1.4 or more and 4.0 or less by including a filler having a specific gravity of 3.0 or more and 9.0 or less so that not only voids are less likely to occur in the adhesives during connecting an adherend or a substrate and a semiconductor chip but also the substrate is less likely to be curved after connection.

Thus, electric devices in which components are connected with adhesives formed in accordance with embodiments of the present invention have not only excellent appearance but also high connection reliability. As used herein, the "specific gravity" means the ratio of the density of a material to the density of water. Adhesives having an overall specific gravity of 4.0 or less are easy to handle during application because they have a low overall viscosity.

The adhesive of the present invention may contain a coupling agent. A coupling agent like a silane coupling agent has a high affinity for both organic materials and inorganic materials. Therefore, if a coupling agent is added to the adhesive of the present invention, the affinity between the adhesive comprising organic materials like binder and adherends comprising inorganic materials like metal wiring or glass substrate is improved.

When a filler having a specific gravity of 3.0 or more and 9.0 or less is added in an amount of 5 parts by volume or more and 35 parts by volume or less on the basis of the total volume of the binder and the hardener representing 100 parts by volume, the overall specific gravity of adhesives can be adjusted to 1.4 or more and 4.0 or less.

The adhesives of the present invention may contain a filler having a specific gravity of 3.0 or more and 9.0 or less and a filler having a specific gravity of less than 3.0 such as silica in combination. However, fillers having a specific gravity of less than 3.0 are not preferred to be used alone because the overall specific gravity of the adhesives becomes low. Fillers having a specific gravity exceeding 9.0 are not preferred because they are readily precipitated in the adhesives.

The binder used in the adhesives of the present invention may be preferably based on an organic compound such as a resin and contains at least a thermosetting resin. If a liquid epoxy resin is used as the thermosetting resin, a pasty adhesive can be obtained without using any organic solvent which has an adverse environmental effect during the process of preparing the adhesive and the process of connecting adherends.

The types of conductive particles added to the adhesives of the present invention are not specifically limited and include metal particles such as nickel particles and gold particles, and metal-coated resin particles formed of resin particle having a coating of a metal such as gold, nickel or solder on their surfaces. Among these conductive particles, metal-coated resin particles generally have a specific gravity in the range of 2.0 or more and 3.0 or less, which is smaller than those of conductive particles formed of metal particles.

When conductive particles consisting of metal-coated resin particles as described above are added to adhesives having a specific gravity of 1.4 or more and 4.0 or less prepared by mixing a filler having a specific gravity of 3.0 or more and 9.0 or less and a binder, therefore, the overall specific gravity of the adhesives neither falls below 1.4 nor exceeds 4.0 after the conductive particles have been added.

Various references represent the following elements: 1, electric device (COF); 12, adhesive; 5, substrate (flexible wiring board); 11, semiconductor chip.

DETAILED DESCRIPTION

Representative embodiments of the present invention are described below.

Adhesives of Examples 1–7 below were first prepared by blending a binder consisting of a pasty thermosetting epoxy resin, a hardener, a coupling agent and an insulating filler. The adhesives are pasty in this state.

Figure 1A:
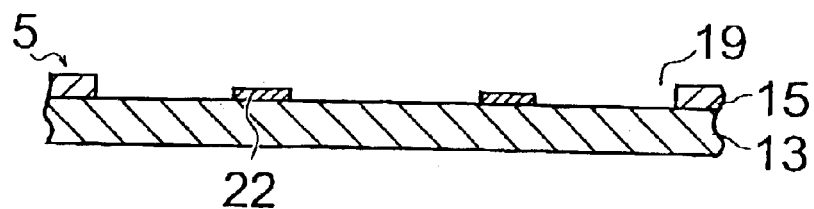
FIGS. 1(a)–(d) illustrates a process for connecting a flexible wiring board and a semiconductor chip using an adhesive of the present invention.

Reference 5 in FIG. 1(a) represents a flexible wiring board. This flexible wiring board 5 comprises a base film 13, metal lines 22 provided on one side of base film 13, and a cover film 15 provided on the side of base film 13 having metal lines 22. An opening 19 is formed in cover film 15, and metal lines 22 and base film 13 are exposed at the bottom of opening 19.

Figure 1B:
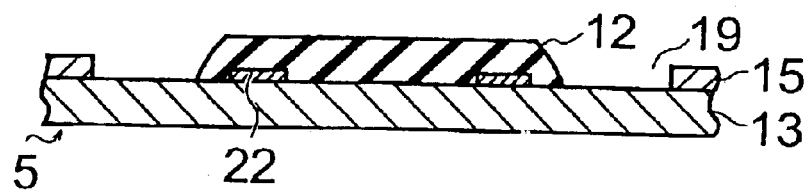

In order to connect a semiconductor chip to this flexible wiring board 5, an adhesive prepared by the process described above may be charged into a dispenser and a given amount of the adhesive is discharged from the nozzle of the dispenser to cover metal lines 22 located in opening 19 in cover film 15. Reference 12 in FIG. 1(b) represents the adhesive discharged.

Figure 1C:
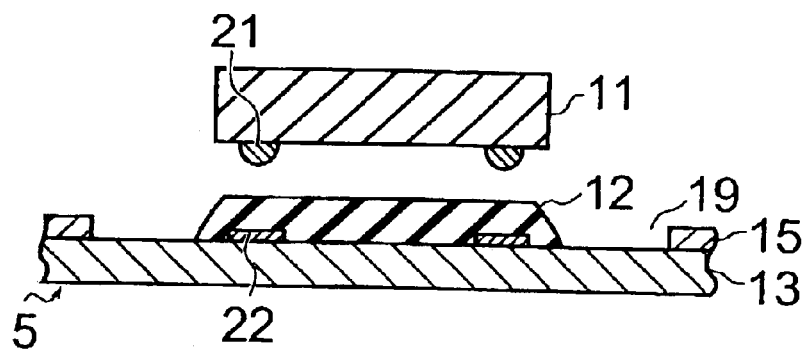

Reference 11 in FIG. 1(c) represents a semiconductor chip. This semiconductor chip 11 has a plurality of bump-like connection terminals 21 projecting on one side of semiconductor chip 11, and these connection terminals 21 are connected to the internal circuit not shown of semiconductor chip 11.

Semiconductor chip 11 and flexible wiring board 5 are aligned in such a manner that connection terminals 21 are opposed to opening 19 in cover film 15, and the side of semiconductor chip 11 having connection terminals 21 is pressed against adhesive 12 in opening 19 in cover film 15, and the assembly is heated while applying pressure on semiconductor chip 11.

Adhesive 12 is pushed aside by pressure but not excessively and connection terminals 21 come into contact with opposed metal lines 22 because the specific gravity of the adhesive is adjusted to 1.4 or more and 4.0 or less by adding a filler.

Figure 1D:
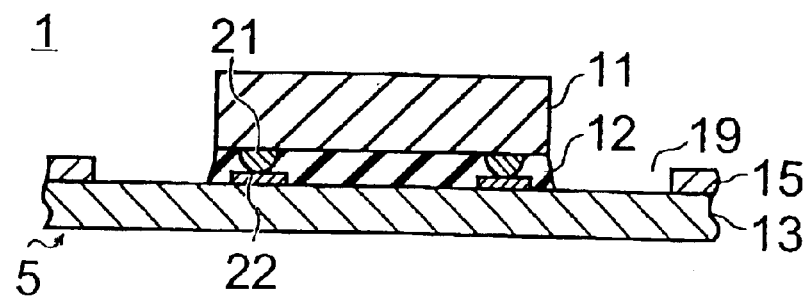

The epoxy resin in adhesive 12 is cured by heating so that adhesive 12 is cured as a whole with connection terminals 21 being in contact with metal lines 22, whereby a COF (Chip on Flex) 1 constituting an electric device is obtained (FIG. 1(d)).

In this COF 1, flexible wiring board 5 and semiconductor chip 11 are not only mechanically connected via cured adhesive 12 but also electrically connected via connection terminals 21.

EXAMPLES

To 60 parts by volume of a binder consisting of a mixture of equal amounts of two liquid epoxy resins (trade names "HP4032" from Dainippon Ink & Chemicals and "EP630" from Yuka Shell Epoxy) were added 40 parts by volume of an imidazole-based hardener (trade name "HX3921" from Asahi Kasei Epoxy) and 3 parts by volume of a coupling agent (trade name "A187" from Nippon Unicar) and the mixture was blended. The mixture of the hardener, coupling agent and binder was pasty and had a viscosity of 20 Pa.s and a specific gravity of about 1.2.

The above chemicals are commercially available, and represent only exemplary embodiments and should not limit the scope of the present invention. On the basis of the total volume of the hardener and the binder representing 100 parts by volume, the fillers shown in the column of "Filler" in Table 1 below were added in the proportions shown in the column of "Amount of filler" in Table 1 below and the mixtures were blended to prepare adhesives of Examples 1–8 and Comparative examples 1–7. Each adhesive was pasty. The adhesives of Examples 1–8 and Comparative examples 1–7 contain no conductive particles.

TABLE 1

Types and amounts of fillers and results of evaluation tests

| | Filler | | Amount of filler | Specific gravity of adhesive | Appearance | Dispensability | Connection reliability | Overall evaluation |
| --- | --- | --- | --- | --- | --- | --- | --- | --- |
| | Specific gravity | Type | | | | | | |
| Example 1 | 8.9 | $Bi_2O_3$ | 5 | 1.6 | o | o | o | o |
| Example 2 | 3.0 | $Al_2O_3/SiO_2$ | 10 | 1.4 | o | o | o | o |
| Example 3 | 3.6 | $Al_2O_3$ | 10 | 1.4 | o | o | o | o |
| Example 4 | 4.0 | $TiO_2$ | 10 | 1.5 | o | o | o | o |
| Example 5 | 8.9 | $Bi_2O_3$ | 10 | 2.0 | o | o | o | o |
| Example 6 | 3.0 | $Al_2O_3/SiO_2$ | 35 | 1.8 | o | o | o | o |
| Example 7 | 4.0 | $TiO_2$ | 35 | 2.2 | o | o | o | o |
| Example 8 | 8.9 | $Bi_2O_3$ | 35 | 3.9 | o | o | o | o |
| Example 9 | 4.0 | $TiO_2$ | 10 | 1.8 | o | o | o | o |
| Comparative Example 1 | 2.1 | $SiO_2$ | 5 | 1.2 | x | o | x | x |
| Comparative Example 2 | 3.0 | $Al_2O_3/SiO_2$ | 5 | 1.3 | x | o | x | x |
| Comparative Example 3 | 3.6 | $Al_2O_3$ | 5 | 1.3 | x | o | x | x |
| Comparative Example 4 | 4.0 | $TiO_2$ | 5 | 1.3 | x | o | x | x |
| Comparative Example 5 | 9.2 | $Yb_2O_3$ | 5 | 1.6 | — | x | — | x |
| Comparative Example 6 | 2.1 | $SiO_2$ | 10 | 1.3 | — | — | — | x |
| Comparative Example 7 | 8.9 | $Bi_2O_3$ | 40 | 4.3 | x | o | x | x |

\*In Table 1 above, "Amount of filler" means the parts by volume of each filler on the basis of the total volume of the binder and the hardener representing 100 parts by volume.
\*\*In Table 1 above, "$Al_2O_3/SiO_2$" means a mixture of alumina and silica.

On the basis of the total volume of the hardener and the binder representing 100 parts by volume used in Examples 1–8 above, 10 parts by volume of the filler of the type shown in the column of "Filler" in Table 1 above and 30 parts by volume of conductive particles having an average particle diameter of 5 μm (metal-coated resin particles formed of resin particle having a gold plating film as a metal coating on their surfaces were used here) were added and blended to prepare an adhesive of Example 9 containing conductive particles.

The fillers used here were the products of C.I. KASEI under trade names "Nanotek $Bi_2O_3$", "Nanotek $Al_2O_3/SiO_2$", "Nanotek $Al_2O_3$", "Nanotek $SiO_2$", "Nanotek $TiO_2$" and "Nanotek $Yb_2O_3$".

A flexible wiring board 5 consisting of the product of Sony Chemicals Corp. under trade name "Hyper Flex" and a semiconductor chip 11 were connected by the process shown in FIGS. 1(a)–(d) using the adhesives of Examples 1–9 and Comparative examples 1–7 to prepare 16 test pieces. The load applied on the semiconductor chip 11 here was 0.6 N per connection terminal 21 and heating conditions involved 210° C. for 5 seconds.

The adhesives of Examples 1–9 and Comparative examples 1–7 and the test pieces prepared with these adhesives were tested for the "specific gravity", "appearance evaluation", "dispensability" and "connection reliability" shown below.

[Specific gravity] The specific gravities of the adhesives of Examples 1–9 and Comparative examples 1–7 were determined. The results are shown in Table 1 above.

[Appearance Evaluation] Each test piece was observed under light microscopy on the side of base film 13 of flexible wiring board 5. The test piece was evaluated as "o" when flexible wiring board 5 was not curved or as "x" when flexible wiring board 5 was curved. These evaluation results are shown in Table 1 above.

[Dispensability] Each of the adhesives of Examples 1–9 and Comparative examples 1–7 was charged into a dispenser having a nozzle diameter of 1.1 mm and a maximum discharge pressure of 0.7 MPa and discharged 20 times, and the weight of the adhesive discharged was measured each time to calculate the average of the weight of each adhesive discharged each time.

Each adhesive was evaluated as "o" if the weight of the adhesive discharged each time of 20 runs was within the range of 0.8 times or more and 1.2 times or less the average weight of the adhesive discharged or "x" if the weight of the adhesive discharged in at least once of 20 runs was outside the range of 0.8 times or more and 1.2 times or less the average. These evaluation results are shown in Table 1 above.

[Connection Reliability] After the 16 test pieces prepared by the process described above were left for 1000 hours under the conditions of 85° C., 85% RH (aging), the conduction resistance of each test piece was determined. The test piece was evaluated as "o" if the conduction resistance was less than 100 mΩ or "x" if it was 100 mΩ or more, and the results are shown in Table 1 above.

The value shown in the column of "Specific gravity of adhesive" in Table 1 above for Example 9 means the specific gravity of the adhesive determined after the conductive particles have been added.

As shown from Table 1 above, the adhesives of Examples 1–9 using fillers having a specific gravity of 3.0 or more and 9.0 or less showed a specific gravity of 1.4 or more and 4.0 or less as well as high evaluation results in "dispensability".

However, the adhesive of Comparative example 5 using a filler having a specific gravity of 9.2 failed to prepare a test piece because the filler in the adhesive precipitated clogging the nozzle of the dispenser and preventing the adhesive from being discharged from the nozzle. The adhesive of Comparative example 6 using 10 parts by volume of a filler having a specific gravity of 2.1 could not be successfully prepared because the viscosity of the adhesive was so high that the filler was not dispersed into the adhesive.

The test pieces using the adhesives of Examples 1–9 gave high evaluation results in both of "appearance" and "connection reliability". In the test pieces using the adhesives of Comparative examples 1–4 having a specific gravity of less than 1.4, however, the flexible wiring board was curved during heating under pressure and the results of "connection reliability" were also poor.

When the adhesive of Comparative example 7 having an overall specific gravity of 4.3 by including 40 parts by volume of a filler having a specific gravity of 8.9 was used, a semiconductor chip and a flexible wiring board could not be electrically connected each other because the viscosity of the adhesive was too high for the semiconductor chip under pressure to penetrate into the adhesive on the flexible wiring board.

As shown by comparing Examples 2 and 3 with Comparative examples 1–3 and 6 above, not only is the discharge of the adhesive good but also a flexible wiring board and a semiconductor chip can be connected by heating under pressure without causing any deformation in the flexible wiring board to prepare an electric device with high connection reliability when the adhesive has a specific gravity of 1.4 or more and 4.0 or less by including a filler (or a mixture of fillers) having a specific gravity of 3.0 or more and 9.0 or less irrespective of whether a single filler is used alone or a mixture of two or more fillers is used.

The present invention is not limited to the foregoing examples in which a semiconductor chip 11 and a flexible wiring board 5 are connected, but can be used to connect various electric devices. For example, a COB (Chip on Board) can be prepared by connecting a semiconductor chip to a rigid substrate in place of the flexible wiring board. Adhesives of the present invention can also be used to connect a LCD (Liquid Crystal Display) and a TCP (Tape Carrier Package) on which a semiconductor chip can be mounted.

Various thermosetting resins can be used in the present invention, such as epoxy resins, urea resins, melamine resins and phenol resins, among which epoxy resins are preferably used in terms of the curing speed or the strength of the adhesive after thermosetting.

Binders containing a thermoplastic resin can also be used. Various thermoplastic resins such as phenoxy resins and polyester resins can be used.

Adhesives consisting of a binder and a filler with no additives such as a hardener or a coupling agent can be prepared, but a hardener is preferably used when an epoxy resin is used as a thermosetting resin.

Various hardeners can be used such as imidazole-based hardeners, polyamine hardeners, phenols, isocyanates, polymercaptans and acid anhydride hardeners. These hardeners can be microencapsulated and used as so-called potential hardeners.

Adhesives of the present invention may contain various additives such as antifoaming agents, colorants and antiaging agents, provided that the specific gravity of the adhesives after adding these additives is preferably in the range of 1.4 or more and 4.0 or less.

The present invention is not limited to the foregoing examples in which the adhesives are pasty.

Figure 2A:
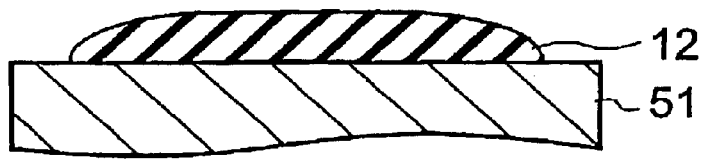
FIGS. 2(a)–(b) illustrates another example of an adhesive of the present invention.
Figure 2B:
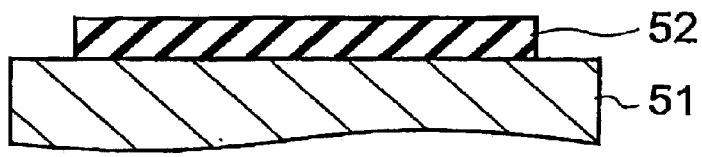
Figure 3:
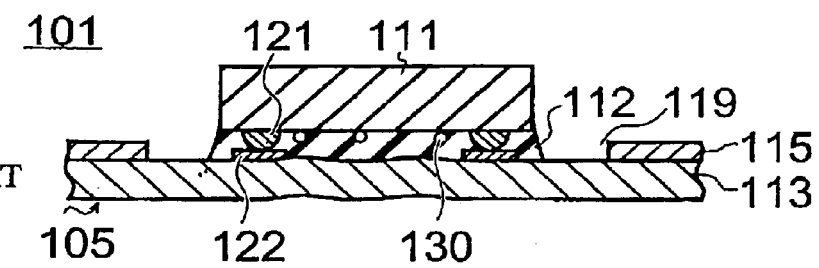
FIG. 3 illustrates an electric device of the prior art.

For example, a pasty adhesive 12 can be mounted on a platform 51 as shown in FIG. 2(a) and heated in such a manner that the adhesive 12 may not be completely cured, and then formed into a film to give an adhesive film 52 consisting of the semi-cured adhesive.

As described above, the adhesive 12 of the present invention contains a filler having a specific gravity of 9.0 or less so that the filler is not precipitated in the adhesive when it is formed into a film and the adhesive has an overall specific gravity of 1.4 or more and 4.0 or less to prevent inclusion of voids when it is formed into a film.

Advantageously, embodiments of the present invention provide adhesives wherein the specific gravity is optimized, thereby not only avoiding inclusion of voids in the adhesives but also preventing adherends or flexible wiring boards from being curved. Thus, electric devices with high connection reliability can be obtained.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less, wherein the filler is contained in an amount of 5 parts by volume or more on the basis of the total volume of the binder and the hardener representing 100 parts by volume.

2. The adhesive of claim 1 wherein the filler is contained in an amount of 35 parts by volume or less on the basis of the total volume of the binder and the hardener representing 100 parts by volume.

3. The adhesive of claim 1 wherein the thermosetting resin contained in the binder comprises an epoxy resin.

4. An adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less, the adhesive containing conductive particles and having a specific gravity of 1.0 or more and 4.0 or less when the conductive particles are included.

5. The adhesive of claim 4 wherein the conductive particles comprise resin particles and a metal coating formed on the surfaces of the resin particles.

6. An adhesive film obtained by forming a film of an adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less, wherein the filler is contained in an amount of 5 parts by volume or more on the basis of the total volume of the binder and the hardener representing 100 parts by volume.

7. An electric device comprising a semiconductor chip and a substrate with an adhesive being inserted between the semiconductor chip and the substrate and cured by heat treatment, wherein the adhesive comprises a binder based on a thermosetting resin, a hardener for the thermosetting resin and an insulating filler, wherein the filler has a specific gravity of 3.0 or more and 9.0 or less and the adhesive has a specific gravity before hardening of the adhesive, 1.4 or more and 4.0 or less.

8. The adhesive of claim 4, wherein the thermosetting resin contained in the binder comprises an epoxy resin.

9. An adhesive film obtained by forming a film of an adhesive comprising a binder based on a thermosetting resin, a hardener for the thermosetting resin and an insulating filler, wherein the filler has a specific gravity of 3.0 or more and 9.0 or less and the adhesive has an overall specific gravity of 1.4 or more and 4.0 or less, the adhesive containing conductive particles and having a specific gravity of 1.0 or more and 4.0 or less when the conductive particles are included.

* * * * *